(12) United States Patent
Imada et al.

(10) Patent No.: US 9,627,567 B2
(45) Date of Patent: Apr. 18, 2017

(54) SOLAR CELL MODULE MANUFACTURING METHOD AND SOLAR CELL MODULE MANUFACTURING APPARATUS

(71) Applicant: Panasonic Intellectual Property Management Co., Ltd., Osaka-shi, Osaka (JP)

(72) Inventors: Naoto Imada, Tokyo (JP); Keisuke Ogawa, Shiga (JP); Tasuku Ishiguro, Osaka (JP)

(73) Assignee: PANASONIC INTELLECTUAL PROPERTY MANAGEMENT CO., LTD., Osaka-shi (JP)

( * ) Notice: Subject to any disclaimer, the term of this patent is extended or adjusted under 35 U.S.C. 154(b) by 0 days.

(21) Appl. No.: 15/133,522

(22) Filed: Apr. 20, 2016

(65) Prior Publication Data
US 2016/0233362 A1    Aug. 11, 2016

Related U.S. Application Data

(63) Continuation of application No. PCT/JP2014/004990, filed on Sep. 30, 2014.

(30) Foreign Application Priority Data

Oct. 24, 2013 (JP) ................................. 2013-220873
Mar. 19, 2014 (JP) ................................. 2014-056358

(51) Int. Cl.
*H01L 31/048* (2014.01)
*H01L 31/18* (2006.01)
*B32B 37/06* (2006.01)

(52) U.S. Cl.
CPC ............ *H01L 31/048* (2013.01); *B32B 37/06* (2013.01); *H01L 31/18* (2013.01); *B32B 2457/12* (2013.01)

(58) Field of Classification Search
USPC .......................................................... 438/66
See application file for complete search history.

(56) References Cited

U.S. PATENT DOCUMENTS 4,233,613 A * 11/1980 Morimoto ......... H01L 21/02381
                                                     257/200
9,272,497 B2 * 3/2016 Khadilkar ............... B32B 37/12
(Continued)

FOREIGN PATENT DOCUMENTS

JP        2002-96388 A      4/2002
JP        2008-117926 A     5/2008

OTHER PUBLICATIONS

Second and Supplementary Notice Informing Applicant of the Communication of the International Application (Form PCT/IB/308) dated Feb. 25, 2016, with Form PCT/IB/326, Form PCT/IB/338 and Form PCT/ISA/237, issued in International Application No. PCT/JP2014/004990, with English translation. (11 pages).

(Continued)

*Primary Examiner* — Zandra Smith
*Assistant Examiner* — Lawrence Tynes, Jr.
(74) *Attorney, Agent, or Firm* — Westerman, Hattori, Daniels & Adrian, LLP

(57) ABSTRACT

Disclosed is a method for manufacturing a solar cell module (10), said method being provided with: a first step for a first step for manufacturing a laminated body by sequentially stacking and thermocompression-bonding a solar cell (11), sealing material (14), first protection member (12) and second protection member (13); and a second step, which is a step of heating the solar cell (11) of the laminated body, and in which the sealing material (14) is indirectly heated due to a temperature increase of the solar cell (11).

20 Claims, 9 Drawing Sheets

(56) References Cited

U.S. PATENT DOCUMENTS

| | | | |
|---|---|---|---|
| 9,318,577 B2* | 4/2016 | Koezuka | H01L 29/66772 |
| 2007/0125420 A1* | 6/2007 | Ezure | H01G 9/2031 |
| | | | 136/263 |
| 2009/0242019 A1* | 10/2009 | Ramamoorthy | H01L 31/0236 |
| | | | 136/255 |
| 2012/0211082 A1* | 8/2012 | Akiyama | C07F 9/5325 |
| | | | 136/263 |
| 2013/0171767 A1* | 7/2013 | Moslehi | H01L 21/26586 |
| | | | 438/89 |
| 2014/0144488 A1* | 5/2014 | Okuyama | B32B 27/08 |
| | | | 136/251 |
| 2015/0270508 A1* | 9/2015 | Naito | C03C 8/24 |
| | | | 257/40 |

OTHER PUBLICATIONS

International Search Report dated Jan. 6, 2015, issued in counterpart International Application No. PCT/JP2014/004990 (1 page).

* cited by examiner

SOLAR CELL MODULE MANUFACTURING METHOD AND SOLAR CELL MODULE MANUFACTURING APPARATUS

CROSS-REFERENCE TO RELATED APPLICATIONS

The present application is a continuation under 35 U.S.C. §120 of PCT/JP2014/004990, filed Sep. 30, 2014, which is incorporated herein by reference and which claimed priority to Japanese Patent Application Nos. 2013-220873 filed on Oct. 24, 2013 and 2014-056358 filed on Mar. 19, 2014. The present application likewise claims priority under 35 U.S.C. §119 to Japanese Patent Application Nos. 2013-220873 filed on Oct. 24, 2013 and 2014-056358 filed on Mar. 19, 2014, the entire content of which is also incorporated herein by reference.

TECHNICAL FIELD

The present disclosure relates to a method for manufacturing a solar cell module and an apparatus for manufacturing a solar cell module.

BACKGROUND

Solar cell modules typically have a structure in which a string of solar cells composed of a plurality of solar cells connected Via a conductor is interposed between two protective components, and an encapsulant is filled between the protective components. For example, Patent Document 1 discloses a method for manufacturing a solar cell module in which a thermally crosslinkable resin sheet is used as the encapsulant. The method disclosed therein includes a step of heating a stack in which solar cells, thermally crosslinkable resin sheets, and protective components are sequentially layered, by applying light having a maximum spectral radiance between a wavelength of 1.2 µm to 12 µm, the spectral radiance at a wavelength of 1.1 µm being 30% or less of the maximum spectral radiance, to press-bond the layers together.

PRIOR ART DOCUMENTS

Patent Documents

Patent Document 1: JP 2008-117926 A

SUMMARY

Problems to be Solved by the Invention

A weak adhesion between the solar cells and the encapsulant may cause exfoliation on interfaces, resulting, in impaired appearance, reduced insulation, or other defects. To strengthen the adhesion, the encapsulant may be heated at higher temperatures. However, if the temperature of the encapsulant becomes too high, volatile components in the encapsulant may generate air bubbles, making impaired appearance or reduced insulation more noticeable.

Means for Solving the Problems

Through diligent efforts for solving the above-described problems, the inventors have discovered that heating the solar cells with higher priority than the encapsulant will strengthen the adhesion between the solar cells and the encapsulant without generation of air bubbles in the encapsulant.

According to an aspect of the present disclosure, there is provided a method for manufacturing a solar cell module. The method includes a first step of sequentially layering and thermocompression-bonding at least one solar cell, at least one encapsulant, and at least one protective component to prepare a stack; and a second step of heating the solar cell of the stack, an increase in temperature of the solar cell indirectly heating the encapsulant.

According to an aspect of the present disclosure, there is provided an apparatus for manufacturing a solar cell module. The apparatus includes a laminator for sequentially layering and thermocompression-bonding at least one solar cell, at least one encapsulant, and at least one protective component to prepare a stack; a heating furnace for heating the stack entirely; a light source for applying light having a maximum peak wavelength of 1500 nm or less to the stack; and a converter for carrying the stack, wherein the light emitted from the light source selectively heats the solar cell of the stack, an increase in temperature of the solar cell indirectly heating the encapsulant.

Advantages of the Invention

According to an aspect of the present disclosure, a solar cell module having an improved adhesion between the solar cell and the encapsulant can be provided.

EMBODIMENTS FOR CARRYING OUT THE INVENTION

Figure 1:
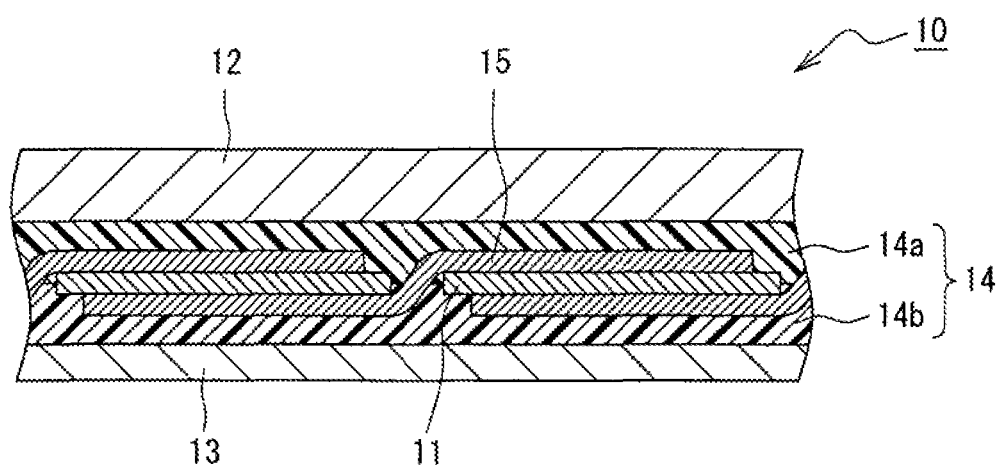
FIG. 1 is a cross-sectional view of a solar cell module according to an example embodiment.

Example embodiments will be described in detail below with reference to the drawings. The drawings used for describing the embodiments are schematic. For example, the ratio of dimensions of structural elements illustrated in the drawings may differ from those of actual products. For example, a specific ratio of dimensions should be understood in consideration of the following description.

FIG. 1 is a cross-sectional view of a solar cell module 10 according to an example embodiment. The solar cell module 10 includes a plurality of solar cells 11, a first protective component 12 provided on a light receiving side of the solar cells 11, and a second protective component 13 provided on a back side of the solar cells 11. The plurality of solar cells 11 are interposed between the first protective component 12 and the second protective component 13, and are sealed by an encapsulant 14 filled between the protective components. The solar cell module 10 includes, for example, a plurality of strings having adjacent solar cells 11 connected via a conductor 15. A string is a linear arrangement of a plurality of solar cells 11 that are serially connected via conductors 15.

The term "light receiving side" of the solar cell module 10 and the solar cells 11 refers to the side on which sunlight is mainly incident (over 50% to 100%), and the term "back side" refers to the side opposite to the light receiving side. The terms "light receiving side" and "back side" are also used for other structural elements such as protective components.

A solar cell 11 includes a photoelectric conversion unit for generating carriers upon reception of sunlight. The photoelectric conversion unit, for example, has a light receiving side electrode formed on the light receiving side and a back side electrode formed on the back side (both not shown). In preferred embodiments, the hack side electrode is formed in a larger area than the light receiving side electrode. The structure of the solar cells 11 is not particularly limited. For example, an electrode may be formed only on the back side of the photoelectric conversion unit. That is, the side on which the area of an electrode is larger or the side on which an electrode is formed is the "back side".

The photoelectric conversion unit, for example, has a semiconductor substrate of, for example, crystalline silicon (c-Si), gallium arsenide (GaAs), or indium phosphide (InP), a noncrystalline semiconductor layer formed on the substrate, and a transparent conductive layer formed on the noncrystalline semiconductor layer. Specific examples include a structure in which an i-type noncrystalline silicon layer, a p-type noncrystalline silicon layer, and a transparent conductive layer are sequentially formed on the light receiving side of an n-type monocrystalline silicon substrate, and an i-type noncrystalline silicon layer, an n-type noncrystalline silicon layer, and a transparent conductive layer are sequentially formed on the back side. In preferred embodiments, the transparent conductive layers are composed of a transparent conductive oxide obtained by doping a metal oxide such as indium oxide ($In_2O_3$) or zinc oxide (ZnO) with, for example, tin (Sn) or antimony (Sb).

An electrode is composed of, for example, a plurality of finger portions and a plurality of bus bar portions. The finger portions are narrow linear electrodes formed over a large area on the transparent conductive layer, and the bus bar portions are electrodes for collecting carriers from the finger portions. In this embodiment, three bus bar portions are provided on both sides of the photoelectric conversion unit, and the conductors 15 are attached on the bus bar portions. The conductors 15 are bent in the thickness direction of the solar cell module 10 between adjacent solar cells 11, and are each attached to the light receiving side of one solar cell 11 and the back side of another solar cell 11 using, for example, an adhesive.

For example, a translucent component such as a glass substrate, a resin substrate, or a resin film can be used for the first protective component 12. Among these, in preferred embodiments, a glass substrate is used for refractoriness, durability and other reasons. The thickness of the glass substrate is not particularly limited, but is preferably about 2 mm to about 6 mm.

Either a translucent component as used for the first protective component 12 Or an opaque component may be used for the second protective component 13. In preferred embodiments, for example, a resin film (resin sheet) is used for the second protective component 13. For the purpose of, for example, reducing water permeability, a layer of a metal such as aluminum or a layer of an inorganic compound such as silica may be formed on the resin film. The thickness of the resin film is not particularly limited, but is preferably about 100 μm to about 300 μm.

In preferred embodiments, the encapsulant 14 includes a first encapsulant 14a (simply referred to as "encapsulant 14a" below) provided between the solar cells 11 and the first protective component 12 and a second encapsulant 14b (simply referred to as "encapsulant 14b" below) provided between the solar cells 11 and the second protective component 13. As will be described in detail below, the solar cell module 10 is manufactured through a lamination step using sheets of encapsulants 14a and 14b. The thickness of the encapsulant 14a or 14b is not particularly limited, but is preferably about 100 μm to about 1000 μm.

The constituent material for the encapsulant 14 is mainly (over 50% by weight) composed of a resin that is usable in the lamination step. The content of this resin in the encapsulant 14 is preferably 80% by weight or more, and more preferably 90% by weight or more. In addition to the resin, the encapsulant 14 may contain various types of additives such as an antioxidant or an ultraviolet absorption agent. The encapsulant 14b may contain a pigment such as titanium oxide. In preferred embodiments, the encapsulant 14 contains at least a coupling agent.

Examples of the resin that is suitable as the main component for the encapsulant 14 include, for example, olefin resins obtained by polymerizing at least one selected from α-olefins having a carbon number of 2 to 20 (for example, polyethylene, polypropylene, or a random or block copolymer of ethylene and another α-olefin), ester resins (for example, a polycondensate of polyol and polycarboxylic acid or an acid anhydride thereof), urethane resins (for example, a polyaddition product of polyisocyanate and an active hydrogen group-containing compound such as diol, polyol, dicarboxylic acid, polycarboxylic acid, polyamine, or polythiol), epoxy resins (for example, a ring-opening polymerization product of polyepoxide or a polyaddition product of polyepoxide and an active hydrogen group-containing compound such as those listed above), and copolymers of an α-olefin and vinyl carboxylate, an acrylic ester, or another vinyl monomer.

Among these, in particularly preferred embodiments, an olefin resin (in particular, an ethylene-containing polymer) or a copolymer of an α-olefin and vinyl carboxylate is used. Among copolymers of an α-olefin and vinyl carboxylate, an ethylene-vinyl acetate copolymer (EVA) is particularly preferred. In preferred embodiments, when an EVA is used, an organic peroxide such as benzoyl peroxide, dicumyl peroxide, or 2,5-dimethyl-2,5-di(t-butylperoxy)hexane is used as a crosslinking agent.

Although the encapsulants 14a and 14b may be composed of the same material, in preferred embodiments, the encapsulants 14a and 14b are composed of different materials for achieving both tolerance to temperature cycles and tolerance to high temperature and high humidity, and for other reasons. Examples of preferred constituent materials for the encapsulants 14a and 14b and combinations thereof include using a resin having a high crosslink density for the encapsulant 14a and a resin having a low crosslink density or a non-crosslinkable resin for the encapsulant 14b. The crosslink density of a resin can be evaluated by gel fraction. A resin having a higher gel fraction tends to have a higher crosslink density.

The coupling agent is contained in at least the encapsulant 14a, and is preferably also contained in the encapsulant 14b. The use of the coupling agent increases adhesion between the solar cells 11 and the encapsulant 14 and facilitates preventing interface exfoliation. Examples of the coupling agent include, for example, a silane coupling agent, a titanate coupling agent, and an aluminate coupling agent. Among these, a silane coupling agent is particularly preferred. Examples of the silane coupling agent include, for example, vinyltriethoxysilane, γ-glycidoxypropyltrimethoxysilane, and γ-metacryloxypropyltrimethoxysilane.

Figure 2:
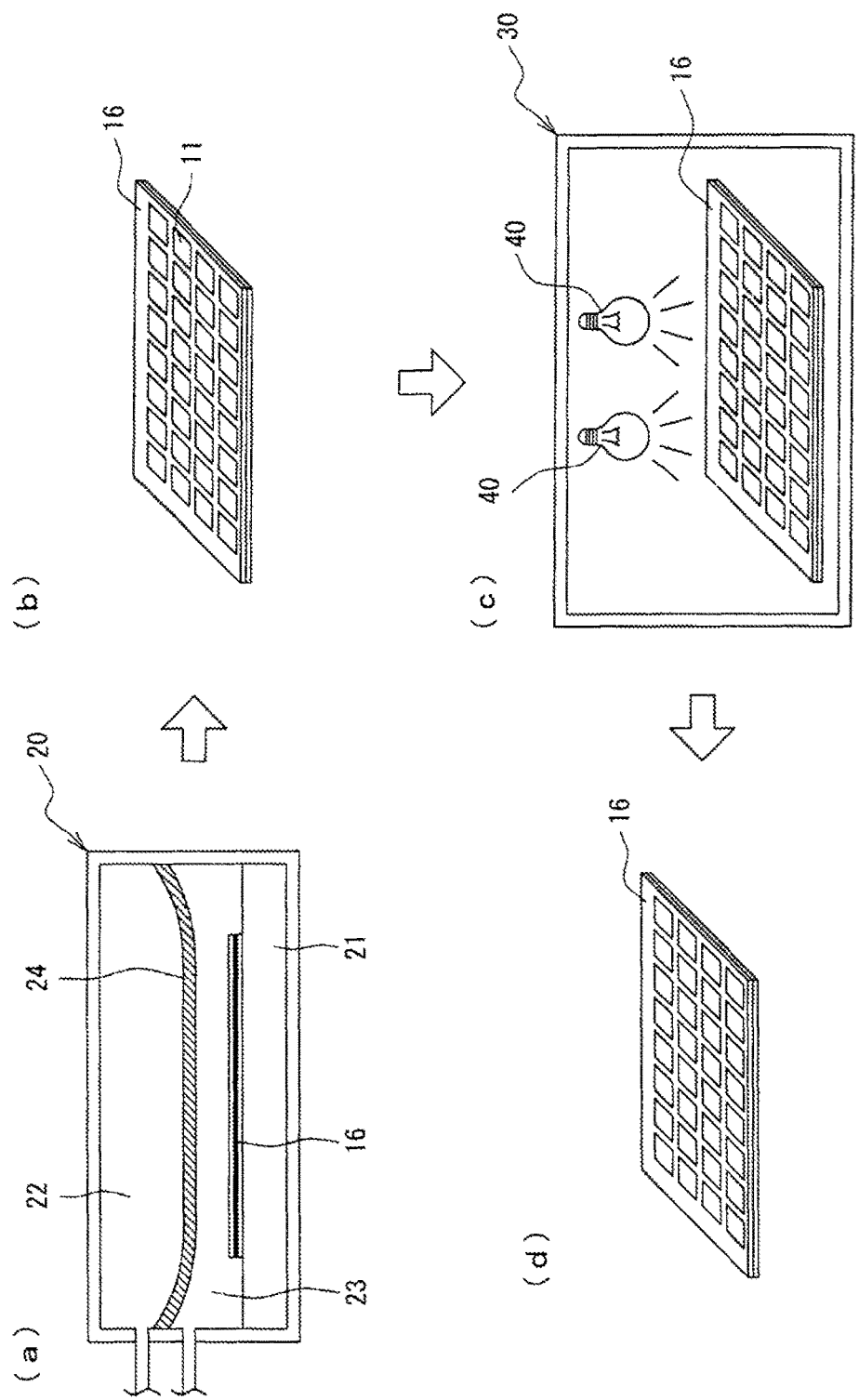
FIG. 2 illustrates a method for manufacturing a solar cell module according to an example embodiment.
Figure 3:
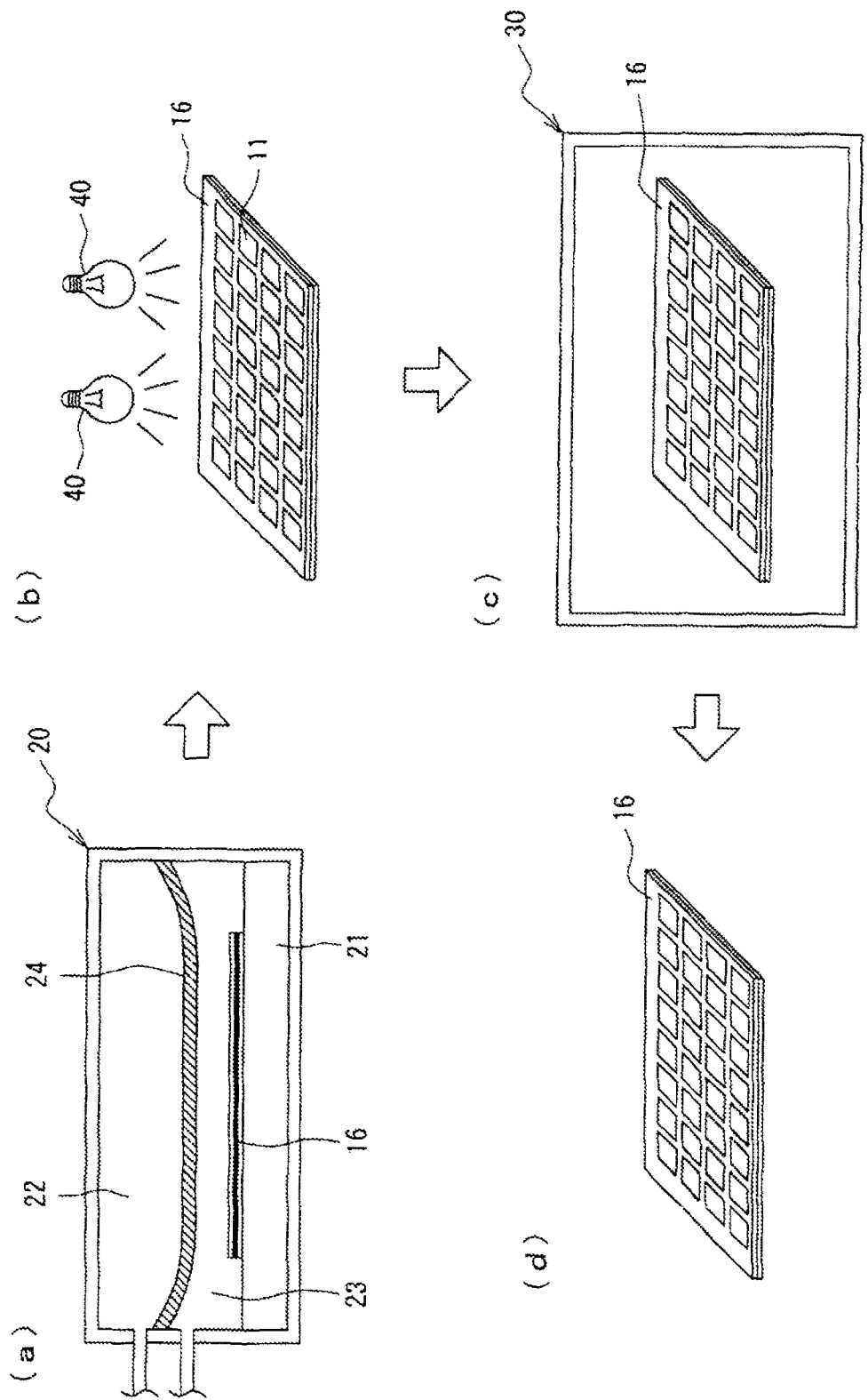
FIG. 3 illustrates a method for manufacturing a solar cell module according to another example embodiment.

FIG. 2 illustrates an example of a manufacturing process for a solar cell module 10 having the above-described structure. The manufacturing process for the solar cell module 10 (referred to as "the present manufacturing process" below) includes a first step (see (a) in FIG. 2) of thermocompression-bonding (laminating) strings of solar cells 11 together with a first protective component 12, a second protective component 13, and sheets of encapsulants 14a and 14b (referred to as "encapsulant sheets 14a and 14b" below) to prepare a stack 16. The first step is referred to as a "lamination step". Strings of solar cells 11 can be prepared by a conventional shown method.

The first step (lamination step) is performed using a laminator 20. The laminator 20 includes, for example, a heater 21 and a vacuum chamber separated into two chambers (an upper vacuum chamber 22 and a lower vacuum chamber 23). The vacuum chamber is partitioned by elastic rubber 24.

In the first step, the first protective component 12, the encapsulant sheet 14a, the solar cells 11, the encapsulant sheet 14b, and the second protective component 13 are layered, in that order, and placed on the heater 21. Subsequently, the layered components are heated by the heater 21 while the upper vacuum chamber 22 and the lower vacuum chamber 23 are being evacuated. Next, the evacuation of the upper vacuum chamber 22 is stopped to introduce air so that the rubber 24 stretches toward the heater 21 to press down the layered components. Heating the layered components at about 150° C. under such conditions softens (melts) resin forming the encapsulant sheets 14a and 14b (referred to as "resin 14" below). Further, if the resin 14 is crosslinkable, the heating causes a crosslinking reaction.

The present manufacturing process includes a second step (see (c) in FIG. 2) of heating the solar cells 11 in the stack 16 prepared in the first step. In the second step, the solar cells 11 in the stack 16 are heated with higher priority. The phrase "the solar cells 11 are heated with higher priority" indicates heating of the solar cells 11 in the stack 16 in a manner such that the temperature of the solar cells 11 increases more quickly than that of the remaining components.

In preferred embodiments, the present manufacturing process includes a curing step (see (c) in FIG. 2) of heating the stack 16 prepared in the first step entirely. The curing step is performed using a heating furnace 30. In the example illustrated in FIG. 2, the second step is performed during the curing step. In other words, the stack 16 prepared in the first step is brought into the heating furnace 30, where the second step and the curing step are performed simultaneously.

The curing step mainly promotes the crosslinking reaction of the resin 14 to increase the crosslink density Any heating furnace that can accommodate the stack 16, for example, a resistance heating furnace, may be used as the heating furnace 30 without any particular limitation. The ambient temperature in the heating furnace 30 is preferably about 100° to about 180° C., and more preferably about 120° C. to about 170° C. (for example, about 160° C.). In consideration of, for example, the promotion of the crosslinking reaction and the productivity; the length of time of the curing step is preferably about 5 minutes to about 60 minutes, and more preferably about 10 minutes to about 45 minutes.

During the second step, by heating the solar cells 11 with higher priority; an increase in the temperature of the solar cells 11 indirectly heats the encapsulant 14. Heat of the solar cells 11 heated in the second step transfers to the encapsulant 14, and locally heats the encapsulant 14 located near the interfaces with the solar cells 11. As such, the means for heating the solar cells 11 in the second step should selectively heat only the solar cells 11 without directly increasing the temperature of the encapsulant 14 or with a small increase in the temperature of the encapsulant 14. As the encapsulant 14 is locally heated in this manner, the adhesion between the solar cells 11 and the encapsulant 14 can be increased while generation of air bubbles in the encapsulant 14 is prevented. The present manufacturing process including the second step is particularly preferred when the encapsulant 14 contains a coupling agent.

The second step is, for example, a light application annealing step of applying light having a maximum peak wavelength of 1500 nm or less (may be referred to as "specific light" below) to the stack 16 to heat the solar cells 11 with higher priority. In other words, in the second step, a light source capable of applying specific light is used to apply light. For the purpose of selectively heating the solar cells 11 and preventing deterioration of for example, the encapsulant 14, the maximum peak wavelength of the specific light is preferably about 400 nm to about 1500 nm, and more preferably about 400 nm to about 1200 nm. Light having a maximum peak wavelength in those ranges is easily absorbed by the solar cells 11 and easily passes through the encapsulant 14, and can therefore increase the temperature of the solar cells 11 with higher priority.

In the second step, a light source capable of applying specific light as described above, wherein the illumination intensity of light having a wavelength of 1500 nm or greater is preferably 1% or less of the maximum peak, and more preferably 0.5% or less of the maximum peak, is used to apply light. Further, in particularly preferred embodiments, the ratio of light having a wavelength of 1200 nm or less in the light (specific light) emitted from the light source is 99% or greater. Because light having a wavelength of over 1200 nm or, in particular, over 1500 nm is easily absorbed by the encapsulant 14 (olefin resin), in preferred embodiments, the specific light applied to the stack 16 contains a higher ratio of light having a wavelength of 1200 nm or less and a lower ratio of light having a wavelength of over 1200 nm or, in particular, over 1500 nm.

Figure 7:
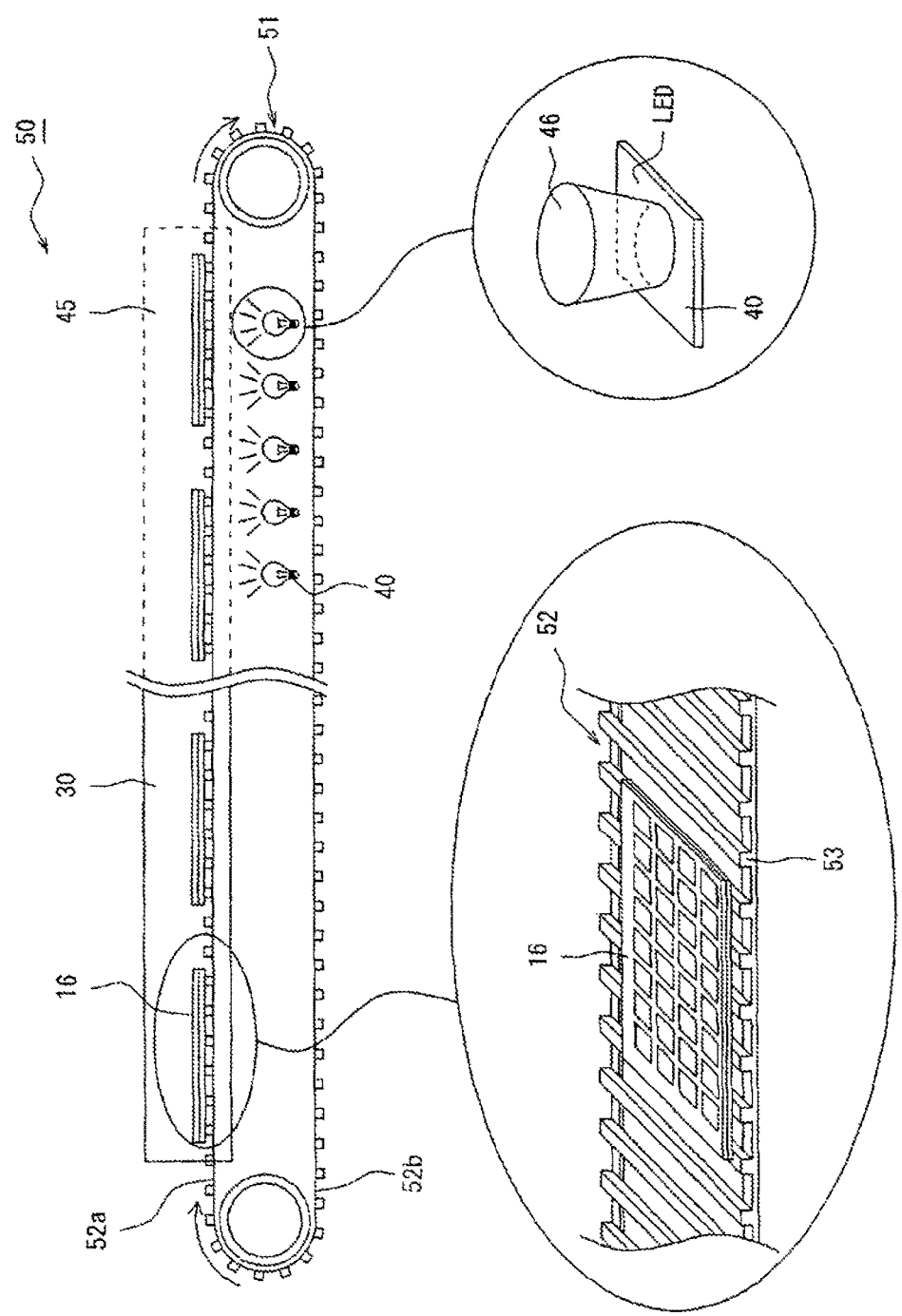
FIG. 7 illustrates an apparatus for manufacturing a solar cell module according to an example embodiment (a laminator in this manufacturing apparatus is not illustrated).
Figure 8:
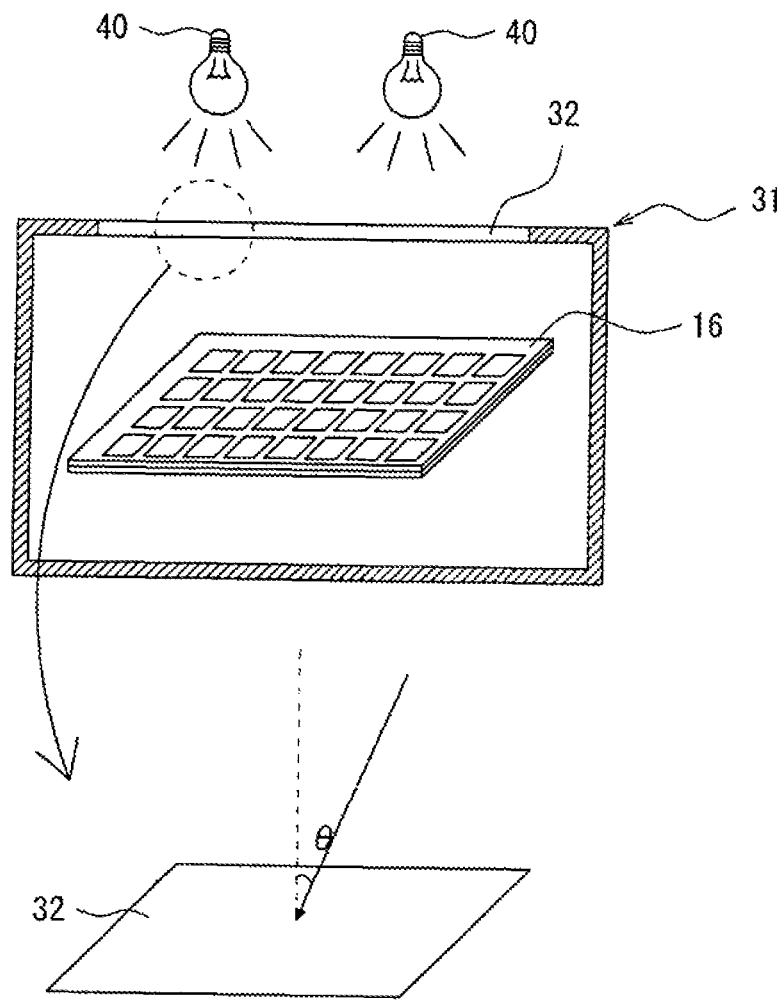
FIG. 8 illustrates a light application unit of an apparatus for manufacturing a solar cell module according to an example embodiment.

Any light source that can apply specific light as described above, for example, a xenon lamp, a halogen lamp, or an LED, may be used as the light source 40 for use in the light application step without any particular limitation. In the example illustrated in FIG. 2, light sources 40 are disposed in the heating furnace 30. Although FIG. 2 and other drawings illustrate the light sources 40 in the shape of light bulbs, as described above, the drawings are schematic, and the illustrations therein do not limit the shape of the light sources. As shown in FIG. 7, which will be described below, an LED substrate may be used as the light sources. While the stack 16 is heated entirely by the heating furnace 30, the application of specific light increases the temperature of the solar cells 11 and the encapsulant 14 near the interfaces with the solar cells 11 to be higher than the temperature of the remaining portions of the stack 16 (the ambient temperature in the heating furnace 30) by, for example, about 2° C. to about 70° C. In preferred embodiments, however, the temperature of the encapsulant 14 near the interfaces with the solar cells 11 is at 200° C. or lower. The temperature to which the solar cells 11 are heated can be adjusted by for example, changing the power of the light sources 40.

When specific light is applied in the second step, although specific light may be applied from both sides of the stack 16 in preferred embodiments, specific light is applied from one side of the stack 16 for productivity and other reasons. In particular, in embodiments in which the second protective component 13 includes a metal layer or in embodiments in which the encapsulant 14b contains a pigment such as titanium oxide, specific light is applied from the side on which the first protective component 12 is located.

In the second step, a current may also be passed through the solar cells 11 in the stack 16 to heat the solar cells 11 with higher priority. In preferred embodiments, a current is passed under, for example, the following conditions:

The power supply may be either a direct current power supply or an alternating current power supply.

The current value is preferably 0.1 A to 50 A, and more preferably 5 A to 20 A.

The heating temperature can be adjusted by changing, for example, the current value. The temperature of the solar cells 11 can be higher than that of the remaining portions by about 1° C. to about 30° C.

The direction in which a current flows is preferably in the forward direction of the solar cells 11 (diodes).

As the means for heating the solar cells 11 in the second step, in addition to the application of specific light and the passage of a current through the solar cells 11, for example, dielectric heating may be employed.

After the above-described steps are completed, other steps, if necessary, including of the stack 16 or attachment of a frame or a terminal box are performed, and then, a solar cell module 10 is obtained.

As described above, the present manufacturing process can locally heat the encapsulant 14 near the interfaces with the solar cells 11, and can prevent the encapsulant 14 from becoming too hot overall. As a result, the adhesion between the solar cells 11 and the encapsulant 14 can be increased while generation of air bubbles in the encapsulant 14 is prevented. Therefore, the present manufacturing process can provide a reliable solar cell module 10 in which problems including impaired appearance and reduced insulation resulting from exfoliation on the interfaces between the solar cells 11 and the encapsulant 14 rarely occur. The present manufacturing process is particularly preferred when the encapsulant 14 contains a coupling agent, because it can significantly promote the reaction between the surfaces of the solar cells 11 and the coupling agent.

FIGS. 3 to 6 illustrate other examples of a manufacturing process for a solar cell module 10. In the example illustrated in FIG. 3, the second step for increasing the adhesion between the solar cells 11 and the encapsulant 14 is performed at a different time to that in the example illustrated in FIG. 2. In the example illustrated in FIG. 3, the second step (see (b) in FIG. 3) is performed between the first step and the curing step. For example, light sources 40 are disposed in a path through which a stack 16 is carried from the laminator 20 to the heating furnace 30 so that the light application step is performed during the carrying.

The temperature (ambient temperature) of the stack 16 during the carrying is at room temperature or higher, for example, at mom. temperature (about 20° C.) to about 150° C., and preferably about 70° C. to about 150° C. In preferred embodiments, the solar cells 11 are heated to 70° C. to 200° C. in the second step by, for example, applying specific light. In the example illustrated in FIG. 3, specific light may be applied from a plurality of light sources 40 disposed in a carrying path for the stack 16. While the stack 16 is being carried.

The second step may be performed after the curing step. The second step may be performed at least once at a time between the first step and the curing step, during the curing step, or after the curing step, and may be performed two or more times. For example, the second step may be performed twice, namely between the first step and the curing step and during the curing step. Also, the second step may be performed twice, namely between the first step and the curing step and after the curing step. Also, the second step may be performed twice, namely during the curing step and after the curing step.

Figure 4:
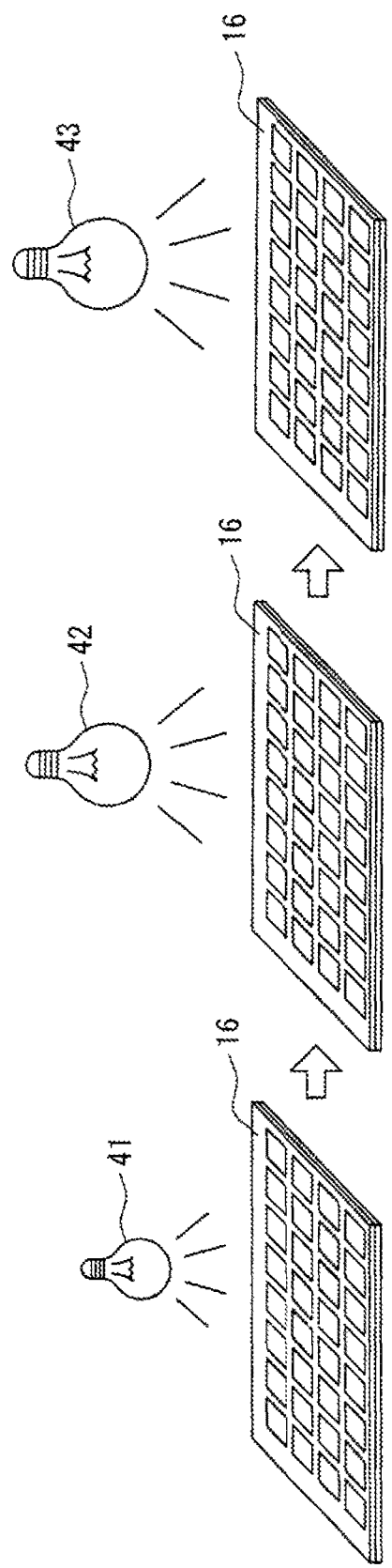
FIG. 4 illustrates a method for manufacturing a solar cell module according to another example embodiment.

In the example illustrated in FIG. 4, the amount of specific light applied during the light application step (may be simply referred to as "amount of light" below) increased as time progresses. For example, the amount of light applied to the stack 16 can be increased stepwise by disposing a plurality of light sources 41, 42, and 43 having different levels of power (or light sources of the same type that are adjusted to produce different levels of power) in order of increasing power from upstream in the carrying path for the stack 16. Alternatively, a single light source may be used. By increasing the power of the light source gradually or stepwise, the amount of light may be increased over time. Further, the amount of light may be adjusted by changing the number of light sources or the length of time of this step.

The light application step in which the amount of light is increased over time is particularly effective if performed after the curing step. In other words, in preferred embodiments, the amount of light is set to be low immediately after the curing step and is increased after a certain period of time from the completion of the curing step. In preferred embodiments, the ambient temperature in the light application step is lower than the ambient temperature in the curing step. The second step is performed under ambient temperature of, for example, 20° C. to 150° C.

Figure 5:
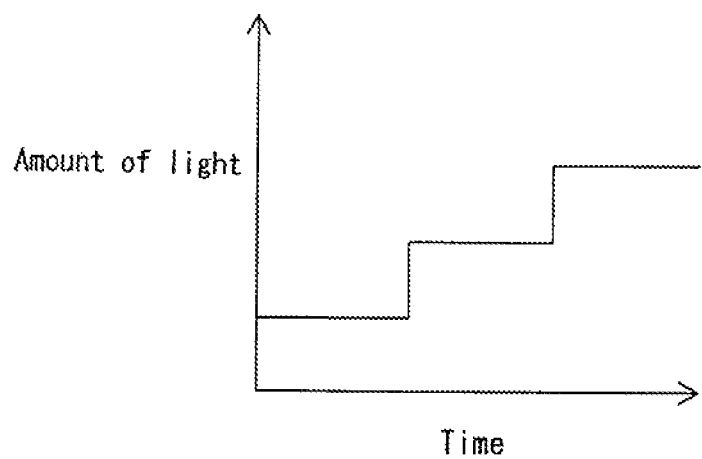
FIG. 5 illustrates effects obtained by employing the method illustrated in FIG. 4.
Figure 5:
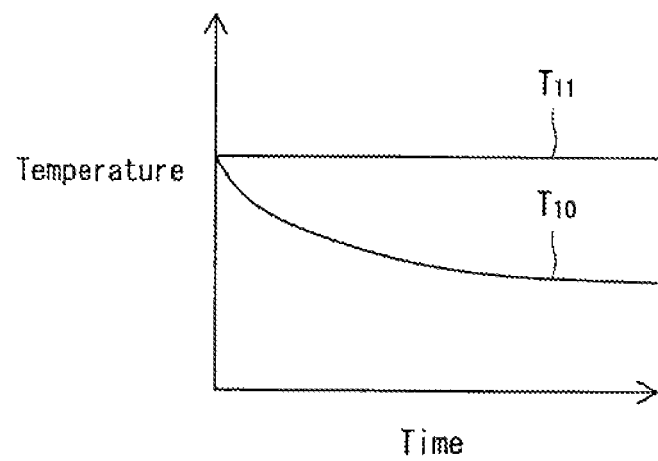

FIG. 5 illustrates temperatures of, for example, the solar cells 11 for which the light application step is performed after the curing step. A stepwise increase in the amount of light after the curing step can, for example, lower the overall temperature $T_{10}$ of the solar cell module 10 (the temperature of portions other than the solar cells 11) while preventing a significant increase in the temperature $T_{11}$ of the solar cells 11. Then, in preferred embodiments, the amount of light is adjusted so that the temperature $T_{11}$ of the solar cells 11 is maintained approximately constant, or more specifically, maintained at the temperature in the curing step. Although it is likely that increasing the amount of light under conditions in which the temperature of the solar cell module 10 is high immediately after the curing step, and as a result overheating the encapsulant 14, will cause, for example, generation of air bubbles, impaired appearance, and reduced insulation, the light application step described above can prevent such defects. By increasing the amount of light over time, for example, while the temperature of the solar cells 11 and the encapsulant 14 near the interfaces with the solar cells 11 is being maintained at about 120° C. to about 170° C., the temperature of the remaining portions can be lowered. Therefore, thermal hysteresis imposed on the entire solar cell module 10 is relaxed., and generation of air bubbles in the encapsulant 14, and other defects, can be prevented.

Figure 6:
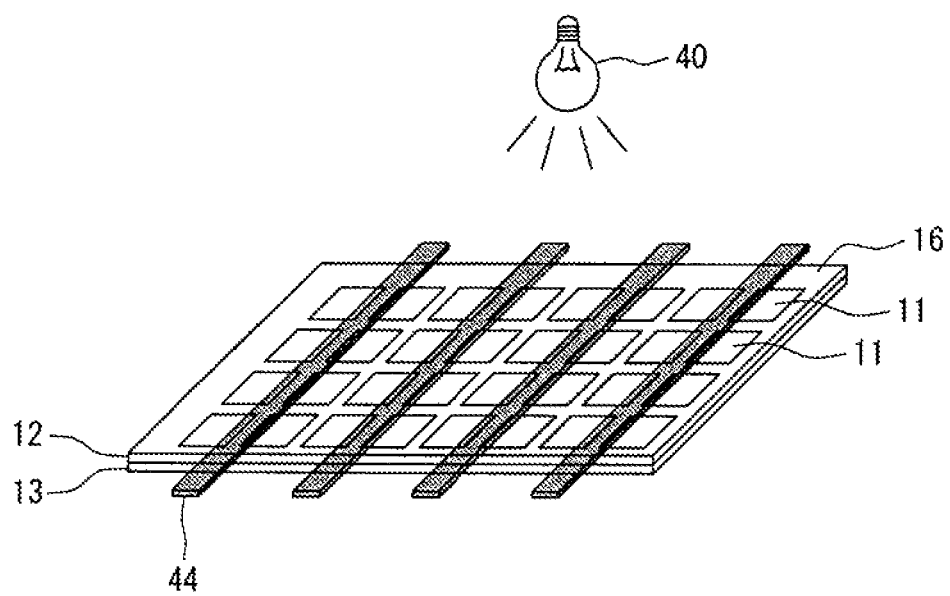
FIG. 6 illustrates a method for manufacturing a solar cell module according to another example embodiment.

In the example illustrated in FIG. 6, high thermal conductivity components 44 are disposed on the first protective component 12, and in this state, specific light is applied to the stack 16 from the side on which the first protective component 12 is located. The high thermal conductivity components 44 are disposed on the first protective component 12 to extend across a plurality of solar cells 11, partially covering each of the solar cells. in other words, in the example illustrated in FIG. 6, the solar cells 11 and the high thermal conductivity components 44 overlap each other in the thickness direction of the stack 16.

The high thermal conductivity components 11 have higher thermal conductivity than the protective components or the encapsulant 14, and perform the function of reducing variation in temperature of the solar cells 11 that is increased by the application of light. In other words, heat is transferred from the high thermal conductivity components 44 whose temperature is increased by the application of light to the plurality of solar cells 11 via, for example, the protective components. As a result, even if different amounts of light are incident upon the solar cells 11, the temperature variation between the solar cells 11 can be reduced, and the adhesion strength between the solar cells 11 and the encapsulant 14 can be made uniform.

For example, metal plates, metal bars, metal wires, or metal meshes may be used as the high thermal conductivity components 44. The high thermal conductivity components 44 have, for example, a width that is somewhat greater than the width of a gap between solar cells 11 and a length that corresponds to the sum of lengths of a plurality of solar cells 11, and may be positioned over gaps between solar cells 11. This structure can make the temperature of the solar cells 11 uniform while avoiding decrease in the amount of light incident upon the solar cells 11. The high thermal conductivity components 44 may be disposed over all solar cells 11, or may be disposed only over portions in which the difference in amounts of light incident upon solar cells 11 is significant. Also, supporting portions of conveyer, which will be described below, may be used as the high thermal conductivity components 44.

An apparatus 50 for manufacturing a solar cell module according to an example embodiment of the present invention will be described in detail below with reference to FIGS. 7 to 11.

FIG. 7 illustrates an apparatus 50 for manufacturing a solar cell module. The apparatus 50 for manufacturing a solar cell module includes a laminator 20 (see FIGS. 2 and 3), a heating furnace 30 for heating stacks 16 entirely, light sources 40 for applying specific light to the stacks 16, and conveyer for carrying the stacks 16. The laminator 20 prepares a stack 16 by sequentially layering and thermo-compression-bonding solar cells 11, an encapsulant 14, and protective components. The light sources 40 are devices for applying specific light to the stack 16, and are specifically, xenon lamps, halogen lamps, metal halide lamps, LEDs, or other devices. Specific light emitted from the light sources 40 selectively heats the solar cells 11, and an increase in the temperature of the solar cells 11 indirectly heats the encapsulant 14.

An example of the conveyer is a belt conveyor 51 in which a plurality of supporting portions 53 for carrying stacks 16 are disposed at predetermined intervals in a longitudinal direction of an endless belt 52. The supporting portions 53 are, for example, metal bars or metal plates extending in the width direction of the belt 52, and ends of the supporting portions 53 are joined together to form the endless belt 52.

For example, the belt conveyor Si carries stacks 16 prepared in the laminator 20 into the heating furnace 30, and subsequently carries the stacks 16 from the heating furnace 30 to a light application unit 45. In other words, the heating furnace 30 is disposed upstream on the belt conveyor 51, and the light application unit 45 is disposed downstream on the belt conveyor 51. The light application unit 45 is a section where a light source 40 is disposed. In the example illustrated in FIG. 7, a plurality of light sources 40 are disposed in the longitudinal direction of the belt 52. The light sources 40 may be of the same type or may be those having different levels of, for example, power. For example, light sources 40 of higher power may be disposed more to a downstream side on the belt conveyor 51 than an upstream side so that the amount of light applied to the stacks 16 is increased as time progresses from the curing step performed in the heating furnace 30.

In preferred embodiments, if the first protective component 12 is a glass substrate and the second protective component 13 is a resin film, the belt conveyor 51 carries the stacks 16 with the glass substrate facing toward the supporting portions 53. In preferred embodiments, this configuration is employed because the glass substrate is less likely to be thermally deformed than the resin film. If the resin film transmits specific light, specific light can be incident from both the glass substrate side and the resin film side (can be incident from both sides). Also, if the protective components are glass substrates, specific light can be incident from both sides. If the resin film hardly or never transmits specific light, light is applied from the glass substrate side.

In preferred embodiments, the light sources 40 are disposed, for example, between a carrier portion 52a and a return portion 52b of the belt 52, and light is applied to the stacks 16 between the supporting portions 53. The carrier portion 52a is a portion on which the stacks 16 are carried and transported, and the return portion 52b is a portion that rims along the back of the carrier portion 52a. In other words, the light sources 40 are disposed in the belt conveyor 51 at positions such that light can be applied to the stacks 16 between the supporting portions 53. The light sources 40 disposed in this manner can apply light more efficiently than, for example, light sources 40 disposed below the belt conveyor 51 (below the return portion 52b).

In preferred embodiments, the light sources 40 are, for example, LEDs. LEDs whose illumination intensity of light haying a wavelength of 1500 nm or greater is preferably 1% or less of the maximum peak, and more preferably 0.5% or less of the maximum peak can be used as the light sources 40. In particularly preferred embodiments, light (specific light) emitted from the LEDs contains light having a wavelength of 1200 nm or less at a ratio of 99% or greater. Examples of such LEDs include LEDs having a COB (chip-on-board) structure. To focus light emitted from the light sources 40 such as LEDs to target positions where light is to be applied, lenses 46 may be provided between the light sources 40 and the stacks 16. The lenses 46 may be made of glass, resin, or metal.

The light application unit 45 may include a heating furnace. For example, the heating furnace 30 may extend along the belt conveyor 51 to the light application unit 45, or, alternatively, in addition to the heating furnace 30, another heating furnace may be used. In either case, in preferred embodiments, the ambient temperature in the light application step is set to be lower than the ambient temperature in the curing step. The ambient temperature may be lowered as time progresses from the curing step.

FIGS. 8 to 11 illustrate other examples of the light application unit 45. In the example illustrated in FIG. 8, similar to the example illustrated in FIG. 2, specific light is applied to a stack 16 in a heating furnace 31, and the curing step and the second step are performed simultaneously. However, the example illustrated in FIG. 8 differs from the example illustrated in FIG. 2 in that light sources 40 are disposed outside the heating furnace 31. In the example illustrated in FIG. 8, at least a portion of a wall of the heating furnace 31 is composed of a translucent component 32 that transmits specific light. Specific light emitted from the light sources 40 disposed outside the heating furnace 31 passes through the translucent component 32 and enters the heating furnace 31. As a result, the lifetime of the light sources 40 can be longer than that of the light sources 40 disposed within the heating furnace.

Examples of the translucent component 32 include glass or a resin sheet that transmits specific light. In preferred embodiments, to enable efficient application of light, a high ratio of specific light emitted from the light sources 40, or specifically 50% or more of all emitted light, is incident upon the glass at an angle of incidence θ of 60° or less. In preferred embodiments, for example, in the example illustrated in FIG. 7, if a heating furnace is disposed in the light application unit 45, the light sources 40 are disposed outside the heating furnace with a translucent component being provided on a portion of the bottom wall the heating furnace.

Figure 9:
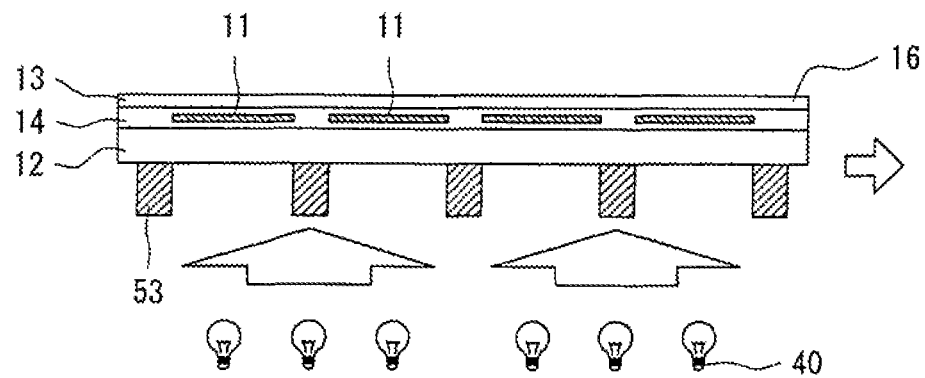
FIG. 9 illustrates a light application unit according to another example embodiment.

In the example illustrated in FIG. 9, the supporting portions 53 of the belt conveyor 51 are located on ends of a stack 16. Further, the supporting portions 53 are located at positions corresponding to gaps between solar cells 11 of the stack 16. Therefore, the solar cells 11 and the supporting portions 53 almost nowhere overlap each other in the thickness direction of the stack 16. In other words, in the example illustrated in FIG. 9, the supporting portions 53 are disposed at intervals corresponding to those of the gaps between the solar cells 11, and stacks 16 are placed on the belt conveyor 51 in such a manner that the supporting portions 53 are located at positions corresponding to the gaps. If there is no difficulty in, for example, the carrying, the supporting portions 53 may be provided either on the ends of the stack 16 or at positions corresponding to the gaps between the solar cells 11. As a result, the loss caused by shading of the supporting portions 53 can be reduced or eliminated.

Figure 10:
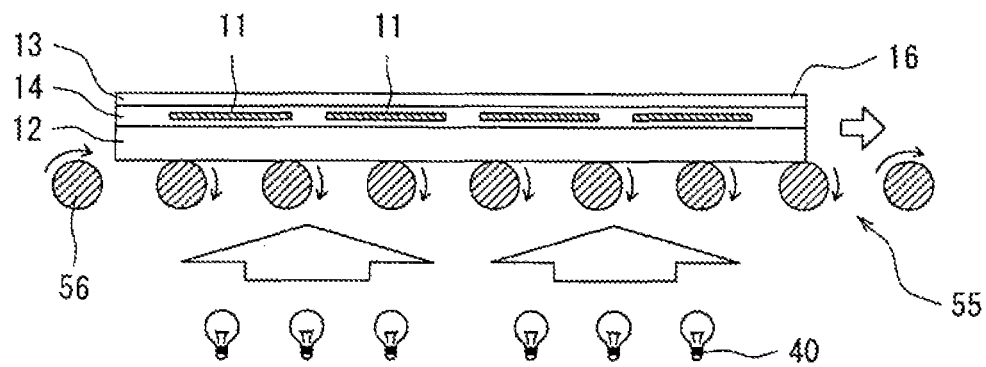
FIG. 10 illustrates a light application unit according to another example embodiment.

In the example illustrated in FIG. 10, a roller conveyor 55 is used as the conveyer. The roller conveyor 55 includes a plurality of carrying rollers 56 serving as the supporting portions on which stacks 16 are to be carried. The light sources 40 are disposed on a backside of the roller conveyor 55, or in other words, below the carrying rollers 56, and apply specific light to the stacks 16 through between the transport rollers 56. In the roller conveyor 55, the positions of the carrying rollers 56 are fixed, and the stacks 16 are carried as, for example, portions of the carrying rollers 56 are driven to rotate. Therefore, because varying portions of the stacks 16 are shaded by the carrying rollers 56, specific light can be uniformly applied to the solar cells 11 of the stacks 16.

Figure 11:
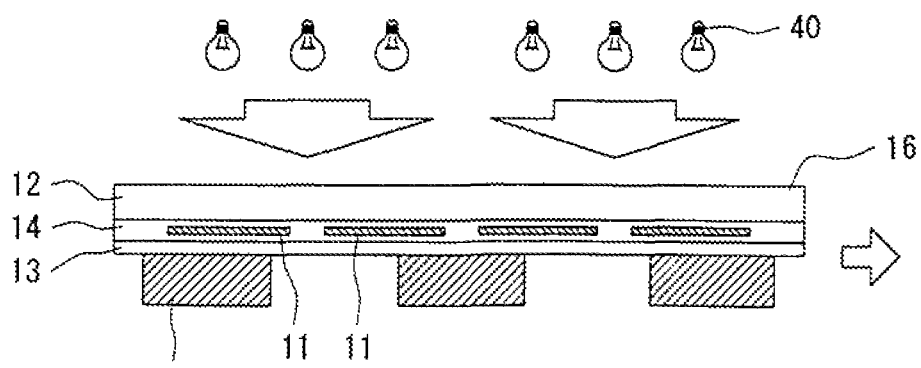
FIG. 11 illustrates a light application unit according to another example embodiment.

In the example illustrated in FIG. 11, a stack 16 is carried with the second protective component 13 (resin film) facing toward the supporting portions 53. In other words, the belt conveyor 51 carries the stack 16 with the first protective component 12 (glass substrate) facing up. In this case again, in preferred embodiments, light is applied to the stack 16 from the glass substrate side, and the light sources 40 are disposed, for example, above the belt conveyor 51.

The supporting portions of the conveyer may also be composed of translucent components such as glass or resin that transmits specific light. Further, the supporting portions, if made of metal, may also be used as high thermal conductivity components as described above.

REFERENCE NUMERALS

10 Solar Cell Module
11 Solar Cell
12 First Protective Component
13 Second Protective Component
14 Encapsulant
14a First Encapsulant
14b Second Encapsulant
15 Conductor
16 Stack
20 Laminator
21 Heater
22 Upper Vacuum Chamber
23 Lower Vacuum Chamber
24 Rubber
30, 31 Heating Furnace
32 Translucent Component
40, 41, 42, 43 Light Source
44 High Thermal Conductivity Component
45 Light Application Unit
46 Lens
50 Apparatus for Manufacturing a Solar Cell Module
51 Belt Conveyor
52 Belt
52a Carrier Portion
52b Return Portion
53 Supporting Portion
55 Roller Conveyor
56 Carrying Roller

The invention claimed is:

1. A method for manufacturing a solar cell module, the method comprising:
   a first step of sequentially layering and thermocompression-bonding at least one solar cell, at least one encapsulant, and at least one protective component to prepare a stack; and
   a second step of heating the solar cell of the stack, an increase in temperature of the solar cell indirectly heating the encapsulant.

2. The method for manufacturing a solar cell module according to claim 1, wherein the second step comprises applying light having a maximum peak wavelength of 1500 nm or less to the stack to heat the solar cell.

3. The method for manufacturing a solar cell module according to claim 2, wherein the second step comprises applying light using a light source whose illumination intensity of light having a wavelength of 1500 nm or greater is 1% or less of the maximum peak.

4. The method for manufacturing a solar cell module according to claim 3, wherein light emitted from the light source contains light having a wavelength of 1200 nm or less at a ratio of 99% or greater.

5. The method for manufacturing a solar cell module according to claim 4, wherein the light source is an LED.

6. The method for manufacturing a solar cell module according to claim 2, wherein the second step comprises applying light having a maximum peak wavelength of 1500 nm or less to the stack after the curing step, wherein the amount of light applied in the second step is increased as time progresses.

7. The method for manufacturing a solar cell module according to claim 2,
wherein the second step comprises applying light having a maximum peak. wavelength of 1500 nm or less to the stack,
wherein the stack includes a plurality of solar cells; and
wherein the second step comprises applying light from the side on which the protective component is located, a high thermal conductivity component being disposed on the protective component to extend across the solar cells, partially covering each of the solar cells.

8. The method for manufacturing a solar cell module according to claim 1, wherein the encapsulant contains a coupling agent.

9. The method for manufacturing a solar cell module according to claim 1, the method further comprising a curing step of heating the stack entirely after the first step, wherein the second step is performed at least once at a time between the first step and the curing step, during the curing step, or after the curing step.

10. The method for manufacturing a solar cell module according to claim 1, wherein the second step comprises heating the solar cell to 70° C. to 200° C.

11. The method for manufacturing a solar cell module according to claim 1, wherein the second step is performed under ambient temperature of 20° C. to 150° C.

12. The method for manufacturing a solar cell module according to claim 1, wherein the second step comprises passing a current through the solar cell in the stack to heat the solar cell.

13. An apparatus for manufacturing a solar cell module, the apparatus comprising:
a laminator for sequentially layering and thermocompression-bonding at least one solar cell, at least one encapsulant, and at least one protective component to prepare a stack;
a heating furnace for heating the stack entirely;
a light source for applying light having a maximum peak wavelength of 1500 nm or less to the stack; and
a conveyer for carrying the stack,
wherein the light emitted from the light source selectively heats the solar cell of the stack, an increase in temperature of the solar cell indirectly heating the encapsulant.

14. The apparatus for manufacturing a solar cell module according to claim 13, wherein the light source is an LED whose illumination intensity of light having a wavelength of 1500 nm or greater is 1% or less of the maximum peak.

15. The apparatus for manufacturing a solar cell module according to claim 14, wherein light emitted from the LED contains light having a wavelength of 1200 nm or less at a ratio of 99% or greater.

16. The apparatus for manufacturing a solar cell module according to claim 13,
wherein the conveyer is a belt conveyor having a plurality of supporting portions for carrying the stack, the supporting portions being disposed at predetermined intervals in a longitudinal direction of an endless belt, and
wherein the light source is disposed between a carrier portion and a return portion of the endless belt to apply light to the stack between the supporting portions.

17. The apparatus for manufacturing a solar cell module according to claim 16,
wherein the stack includes a plurality of solar cells; and
wherein the supporting portions of the belt conveyor are located at least either on ends of the stack or at positions corresponding to gaps between the solar cells of the stack.

18. The apparatus for manufacturing a solar cell module according to claim 13,
wherein the conveyer is a roller conveyor having a plurality of carrying rollers that serve as supporting portions for carrying the stack, and
wherein the light source is disposed on a backside of the roller conveyor to apply light to the stack between the carrying rollers.

19. The apparatus for manufacturing a solar cell module according to claim 13,
wherein the stack includes a glass substrate and a resin film that serve as the protective component, the glass substrate being disposed on one side of the solar cell and a resin film being disposed on another side of the solar cell, the stack being carried by the conveyer with the resin film facing toward the supporting portions, and
wherein the light source applies the light to the stack from the side on which the glass substrate is located.

20. The apparatus for manufacturing a solar cell module according to claim 13,
wherein at least a portion of a wall of the heating furnace is composed of a translucent component, and
wherein the light source is disposed outside the heating furnace to apply the light to the stack in the heating furnace through the translucent component.

* * * * *